(12) United States Patent
Kim

(10) Patent No.: US 9,543,317 B2
(45) Date of Patent: Jan. 10, 2017

(54) SEMICONDUCTOR DEVICE AND METHOD OF MANUFACTURING THE SAME

(71) Applicant: SK hynix Inc., Gyeonggi-do (KR)

(72) Inventor: Tae Kyung Kim, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/712,629

(22) Filed: May 14, 2015

(65) Prior Publication Data
US 2016/0172371 A1 Jun. 16, 2016

(30) Foreign Application Priority Data

Dec. 12, 2014 (KR) .......................... 10-2014-0179781

(51) Int. Cl.
H01L 27/115 (2006.01)
H01L 29/10 (2006.01)
(52) U.S. Cl.
CPC ... *H01L 27/11582* (2013.01); *H01L 27/11565* (2013.01); *H01L 27/11575* (2013.01); *H01L 29/1083* (2013.01)
(58) Field of Classification Search
CPC ............. H01L 29/7926; H01L 29/7889; H01L 29/7827; H01L 29/66666
See application file for complete search history.

(56) References Cited

U.S. PATENT DOCUMENTS

| 2001/0041250 A1* | 11/2001 | Werkhoven ........... C23C 16/029 428/212 |
| 2009/0098725 A1* | 4/2009 | Nam ................. H01L 21/31116 438/618 |
| 2011/0284943 A1* | 11/2011 | Hwang ............... H01L 27/0207 257/314 |
| 2014/0054787 A1* | 2/2014 | Eun ..................... H01L 27/2481 257/773 |

FOREIGN PATENT DOCUMENTS

KR 1020150113265 10/2015

\* cited by examiner

Primary Examiner — Dale E Page
Assistant Examiner — John Bodnar
(74) Attorney, Agent, or Firm — IP & T Group LLP

(57) ABSTRACT

A semiconductor device includes interlayer insulating films spaced apart from each other and stacked over each other, and wherein first ends of the interlayer insulating films form a stepped structure; a slit penetrating the interlayer insulating films and dividing the interlayer insulating films into a plurality of stack structures; line patterns arranged between adjacent interlayer insulating films and separated from each other by the slit; pad patterns connected to the line patterns, formed over the first ends of the interlayer insulating films, and separated from each other by the slit; and at least one punch prevention pattern formed over sidewalls of the pad patterns adjacent to the slit and formed over the first ends of the interlayer insulating films.

20 Claims, 17 Drawing Sheets

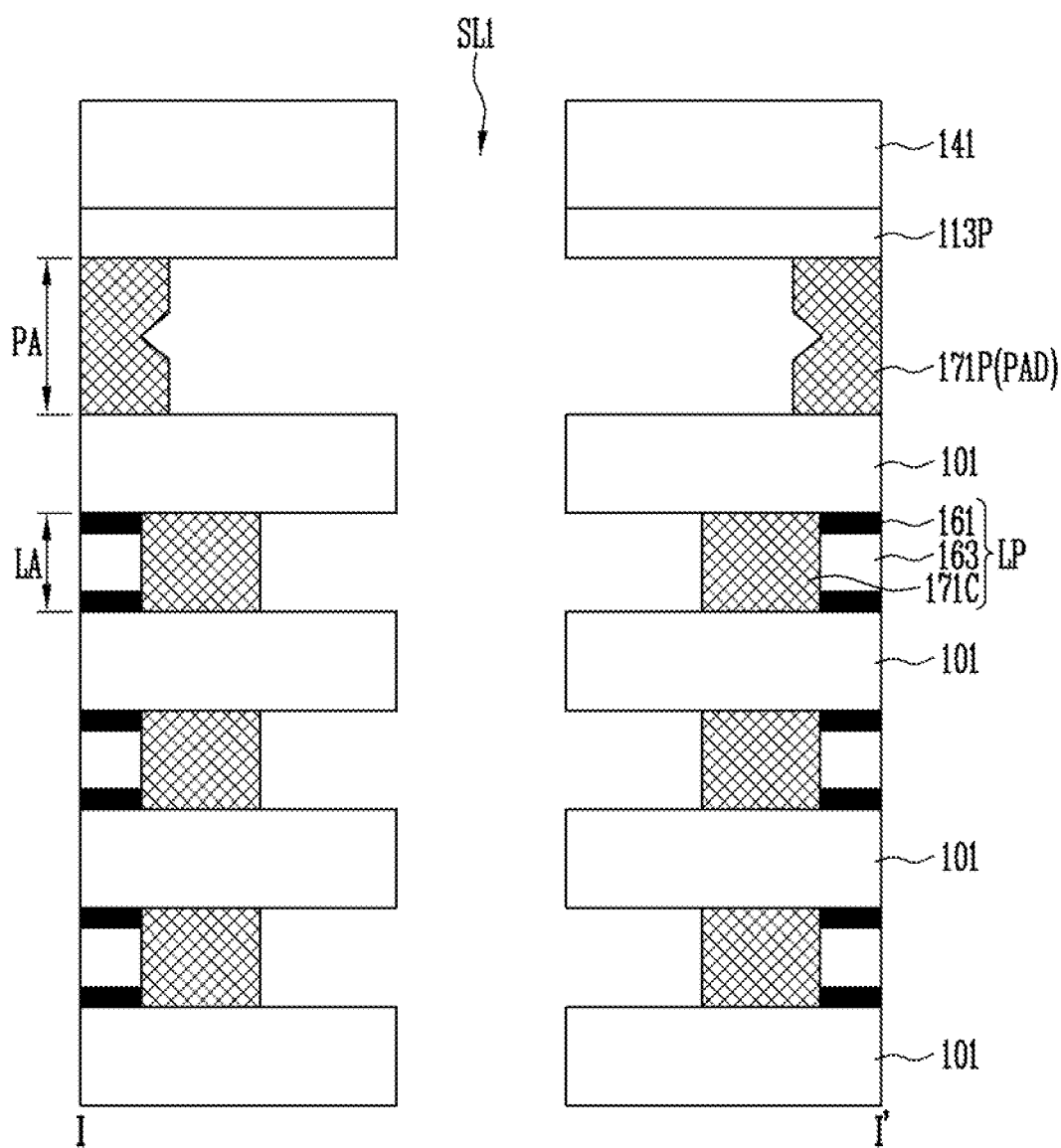

SEMICONDUCTOR DEVICE AND METHOD OF MANUFACTURING THE SAME

CROSS-REFERENCE TO RELATED APPLICATION

The present application claims priority to Korean patent application number 10-2014-0179781, filed on Dec. 12, 2014, which is herein incorporated by reference in its entirety.

BACKGROUND

Field of Invention

The present invention relates to a semiconductor device and a method of manufacturing the same. More specifically, the present invention relates to a three-dimensional semiconductor device and a method of manufacturing the same.

Description of Related Art

A semiconductor device capable of increasing a degree of integration is being developed as various structures. As an example, a three-dimensional semiconductor device including a three-dimensional memory device has been proposed.

The three-dimensional memory device may include memory cells that are spaced apart from each other along a channel film, and are stacked. The memory cells are connected to conductive patterns. The conductive patterns may cover the channel film, may be spaced apart from each other along the channel film and may be stacked.

During the process of forming the conductive patterns described above, a seam may be generated in a portion of the conductive patterns. The seam causes structural defects of the three-dimensional semiconductor device, and degrades reliability of an operation.

SUMMARY

The present invention is directed to a semiconductor device capable of decreasing structural defects and improving reliability of an operation, and a method of manufacturing the same.

One aspect of the present invention provides a semiconductor device including: interlayer insulating films spaced apart from each other and stacked over each other, wherein first ends of the interlayer insulating films form a stepped structure; a slit penetrating the interlayer insulating films and dividing the interlayer insulating films into a plurality of stack structures; line patterns arranged between adjacent interlayer insulating films and separated from each other by the slit; pad patterns connected to the line patterns, formed over the first ends of the interlayer insulating films, and separated from each other by the slit; and at least one punch prevention pattern formed over sidewalls of the pad patterns adjacent to the slit and formed over the first ends of the interlayer insulating films.

Another aspect of the present invention provides semiconductor device including: a memory cell stack provided in a cell region a line pattern extending from the memory cell stack to a contact region in a first direction; a pad pattern extending from the line pattern and provided in the contact region; a punch prevention pattern extending from the pad pattern in a second direction perpendicular to the first direction and provided in the contact region; and a contact plug coupled to both of the pad pattern and the punch prevention pattern.

BRIEF DESCRIPTION OF THE DRAWINGS

FIGS. 4A to 8 are diagrams for describing a method of manufacturing a semiconductor device according to embodiments of the present invention;

DETAILED DESCRIPTION

Exemplary embodiments of the present invention will be described more fully hereinafter with reference to the accompanying drawings. The present invention may, however, be embodied in different forms and should not be construed as limited to the embodiments set forth herein. Exemplary embodiments of the present invention are described below in sufficient detail with reference to accompanying drawings to enable those of ordinary skill in the art to embody and practice the present invention.

Figure 1:
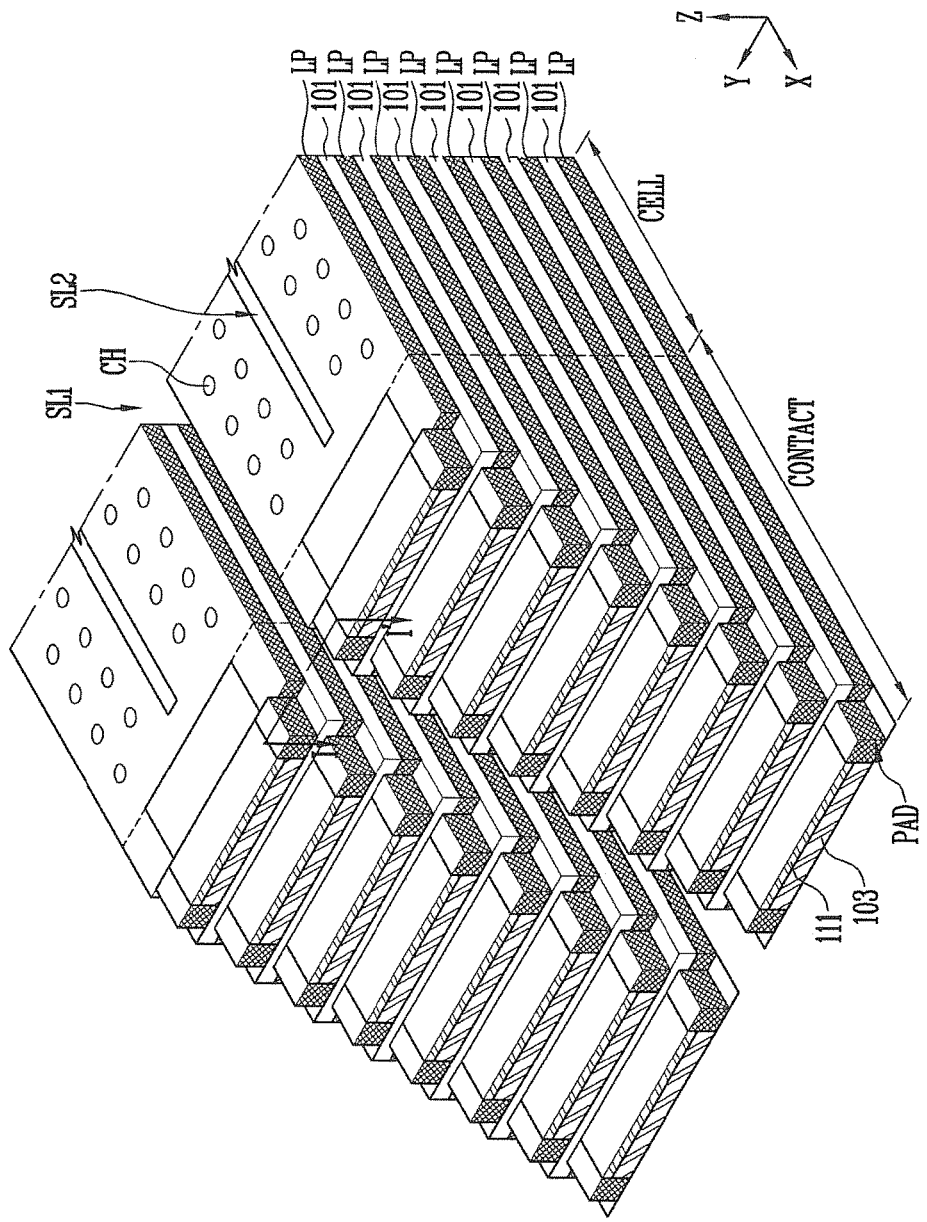
FIG. 1 is a perspective view illustrating a semiconductor device according to an exemplary embodiment of the present invention.

FIG. 1 is a perspective view illustrating a semiconductor device according to an exemplary embodiment of the present invention.

Referring to FIG. 1, a semiconductor device according to an exemplary embodiment of the present invention may include a contact region CONTACT and a cell region CELL. The cell region CELL may be a region in which a memory string including memory cells, which are arranged in a three-dimensional structure, is arranged. The contact region CONTACT may be a region in which contact plugs (not shown) connected to the memory string are arranged.

The memory string may include memory cells and select transistors, which are arranged in series along a channel film CH. The memory string and the channel film CH may be formed as various structures. The structure of the memory string and the channel film CH will be described in detail below with reference to FIGS. 9 and 10.

The channel film CH may penetrate first interlayer insulating films 101 and line patterns LP, which are alternately stacked. The line patterns LP may be word lines connected to gates of the memory cells, or a select line connected to a gate of the select transistor. The select line and the word lines may be diversely arranged according to the structure of the memory string. Arrangements of the select line and the word lines will be described in detail below with reference to FIGS. 9 and 10.

The first interlayer insulating films 101 and the line patterns LP may be extended from the cell region CELL, and include ends having a stepped structure in the contact region CONTACT. More particularly, the line patterns LP may have a stepped structure extending more toward the contact region CONTACT since the line pattern LP is located in a lower position. The interlayer insulating films 101 may have a stepped structure extending more toward the contact region CONTACT since the interlayer insulating film 101 is located in a lower position.

The first interlayer insulating films 101 and the line patterns LP may be divided into a plurality of stepped stack structures by a first slit SL1. Further, each of the stack structures divided by the first slit SL1 may be penetrated by a second slit SL2 formed in the cell region CELL. The number of the first interlayer insulating films 101 and the line patterns LP which are stacked, may be diversely changed according to the number of memory cells and select transistors to be stacked. The first and second slits SL1 and SL2 may be filled with an insulating material.

Each of the ends of the line patterns LP extended toward the contact region CONTACT may be divided into at least two parts by interposing a first sacrificial film 103. For example, one line pattern LP may include ends divided into two parts by interposing one first sacrificial film 103 arranged on the same plane.

The ends of the line patterns LP may be connected to pad patterns PAD arranged in the contact region CONTACT. The pad patterns PAD may be connected to sidewalls of the line patterns LP. The pad patterns PAD may be arranged on one end of each of the first interlayer insulating films 101 having the stepped structure. The pad patterns PAD formed on the same plane may be divided by interposing the first slit SL1 on the first sacrificial film 103.

The pad patterns PAD may have greater thicknesses than the line patterns LP. When the pad patterns PAD having the greater thicknesses than the line patterns LP are formed, a second sacrificial film 111 may be formed on the first sacrificial film 103. The pad patterns PAD may be formed using various methods. A process of forming the second sacrificial film 111 may be omitted according to a process of forming the pad patterns PAD. The second sacrificial film 111 may not remain in a final structure so the second sacrificial film 111 is removed.

As described above, an area in which the line patterns LP are formed may have a smaller width than an area in which the pad patterns PAD are formed. Accordingly, the line patterns LP may be formed at a closer position to the first slit SL1 than the pad patterns PAD. When the line patterns LP are formed at the closer position to the first slit SL1 than the pad patterns PAD, a punch phenomenon may be generated in the process of forming the contact plugs (not shown). The contact plugs (not shown) may be arranged on the pad patterns PAD and be connected to the pad patterns PAD. The punch-through phenomenon may mean that the contact plugs (not shown) penetrate the pad patterns PAD and the first interlayer insulating films 101 arranged on a lower portion of the pad patterns PAD. Due to the punch-through phenomenon, the line patterns LP arranged on different levels may be electrically connected through the contact plugs (not shown). Accordingly, a malfunction of the semiconductor device can be generated.

To reduce the punch-through phenomenon, exemplary embodiments of the present invention may form a punch prevention pattern on sidewalls of the pad patterns PAD adjacent to the first slit SL1. Hereinafter, the punch prevention pattern will be described in detail with reference to FIGS. 2A to 2D.

FIGS. 2A to 2D are perspective views illustrating patterns which are formed in a pad pattern area and a line pattern area shown in FIG. 1. The pad pattern area and the line pattern area may be arranged on different levels, and be an area defined between adjacent interlayer insulating films.

Referring to FIGS. 2A to 2D the pad pattern PAD and the punch prevention pattern 191P or 281 may be formed in a pad pattern area PA according to exemplary embodiments of the present invention.

Figure 2A:
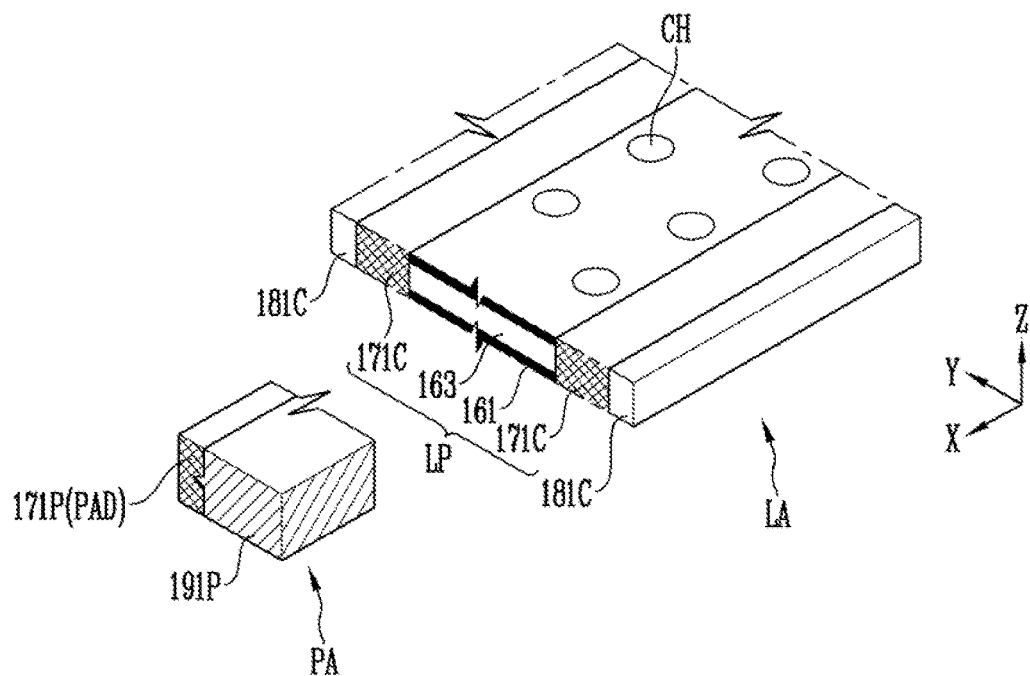
FIGS. 2A to 2D are perspective views illustrating patterns which are formed in a pad pattern area and a line pattern area.
Figure 2B:
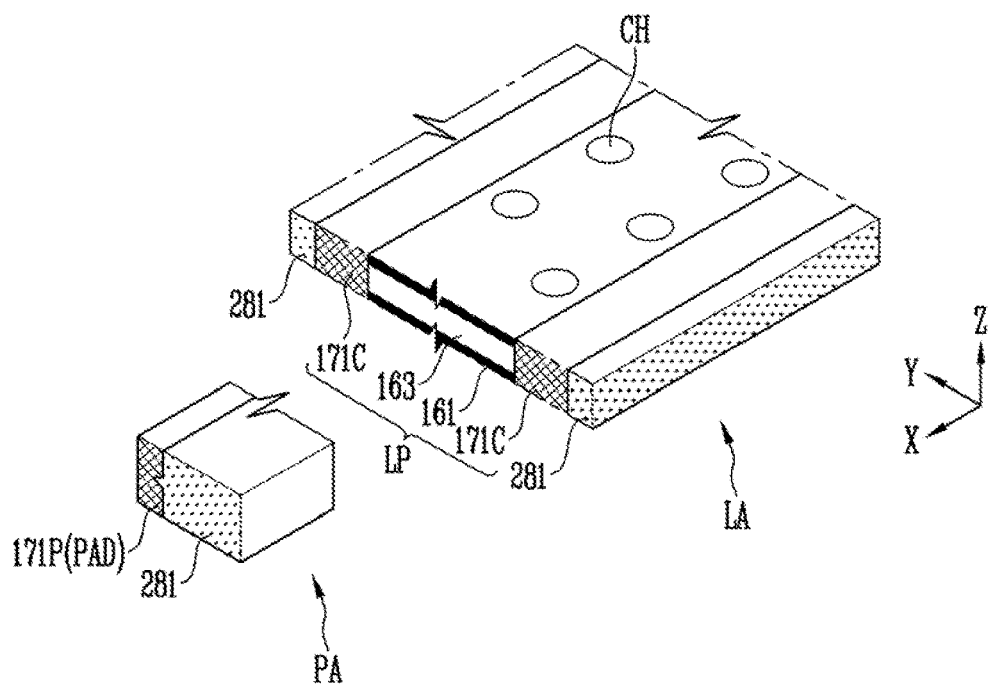
Figure 2C:
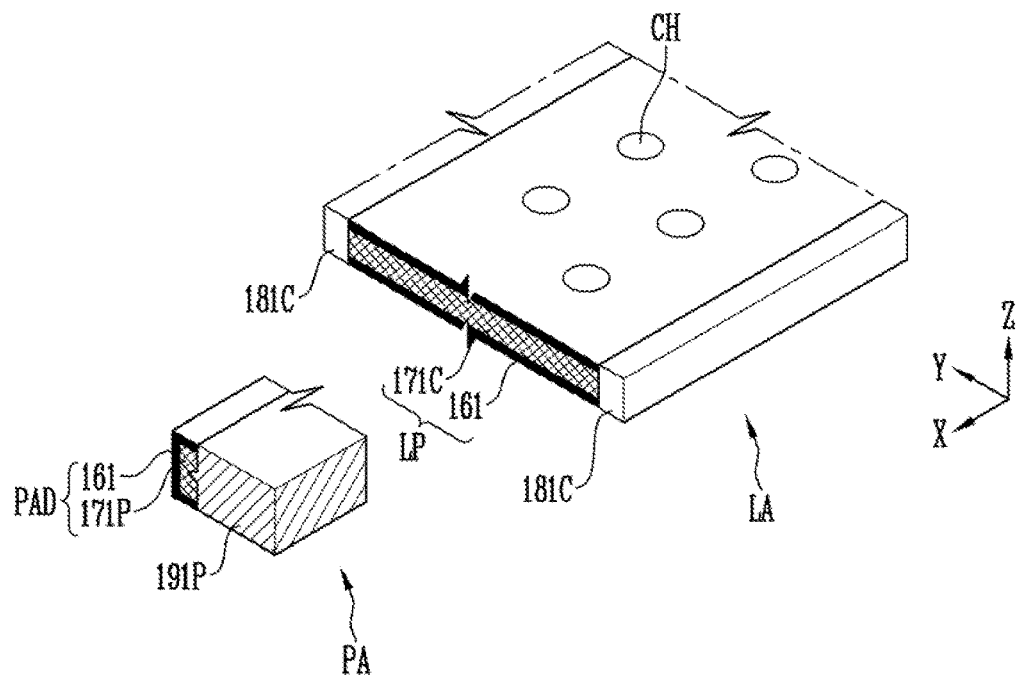

As shown in FIGS. 2A and 2B, the pad pattern PAD may be a first conductive material pattern 171P. A first conductive material may include a polysilicon film, a metal film, a metal silicide film, or a combination thereof. The metal film may include tungsten. As shown in FIGS. 2C and 2O, the pad pattern PAD may further include a barrier metal 161 covering the first conductive material pattern 171P.

As shown in FIGS. 2A and 2C, the punch prevention pattern 191P may be formed on a sidewall of the pad pattern PAD and be formed of a second conductive material. When the punch prevention pattern 191P is formed of the second conductive material, the punch prevention pattern 191P may be divided into two or more by the first slit SL1 shown in FIG. 1. The punch prevention pattern 191P may not be formed in a line pattern area LA and the first slit SL1, but is formed only in the pad pattern area PA. The punch prevention pattern 191P formed of the second conductive material may be in contact with the pad pattern PAD and decrease a resistance of the pad pattern PAD. The second conductive material may be the same material as the first conductive material. The pad pattern PAD may include a sidewall having a groove. See FIGS. 3A and 3B. Although not shown, in another embodiment, the sidewall of the pad pattern PAD may be formed evenly according to a method of performing a process.

Referring to FIGS. 2A to 2D, the line pattern LP and an insulating pattern 181C may be formed in the line pattern area LA. However, in another embodiment, the line pattern LP and the punch prevention pattern 191P may be formed in the line pattern area LA. The line pattern LP may be formed to surround the plurality of channel films CH. The channel films CH surrounded by the line pattern LP may be arranged in two or more rows along the direction in which the line pattern LP extends. The channel films CH arranged in two or more rows along the direction in which the line pattern LP extends, may be arranged in a staggered manner, or may be arranged side by side.

As shown in FIGS. 2A and 2B, the line pattern LP may include a center area filled with a core pattern 163, and side areas which are arranged on both sides of the center area. Each of the side areas may be filled with a first conductive material pattern 171C. The core pattern 163 may be formed of an insulating material such as an oxide material. The core pattern 163 may be formed to fill a space between the channel films CH. The core pattern 163 may prevent damage of a multilayer memory film around the channel film CH. The multilayer memory film will be described below with reference to FIGS. 8 and 9. The first conductive material pattern 171C configuring the line pattern LP may extend further toward the first slit (SL1 of FIG. 1) than the first conductive material pattern 171P configuring the pad pattern PAD. The line pattern LP may further include the barrier metal 161. The barrier metal 161 may be formed along a surface of the core pattern 163, and open a sidewall of the core pattern 163, which is in contact with the first conductive material pattern 171C. Although not shown, the line pattern LP may further include a barrier metal surrounding the first conductive material pattern 171C. In this case, the barrier metal may be extended to surround the first conductive material pattern 171P configuring the pad pattern PAD shown in FIGS. 2A and 2B.

Figure 2D:
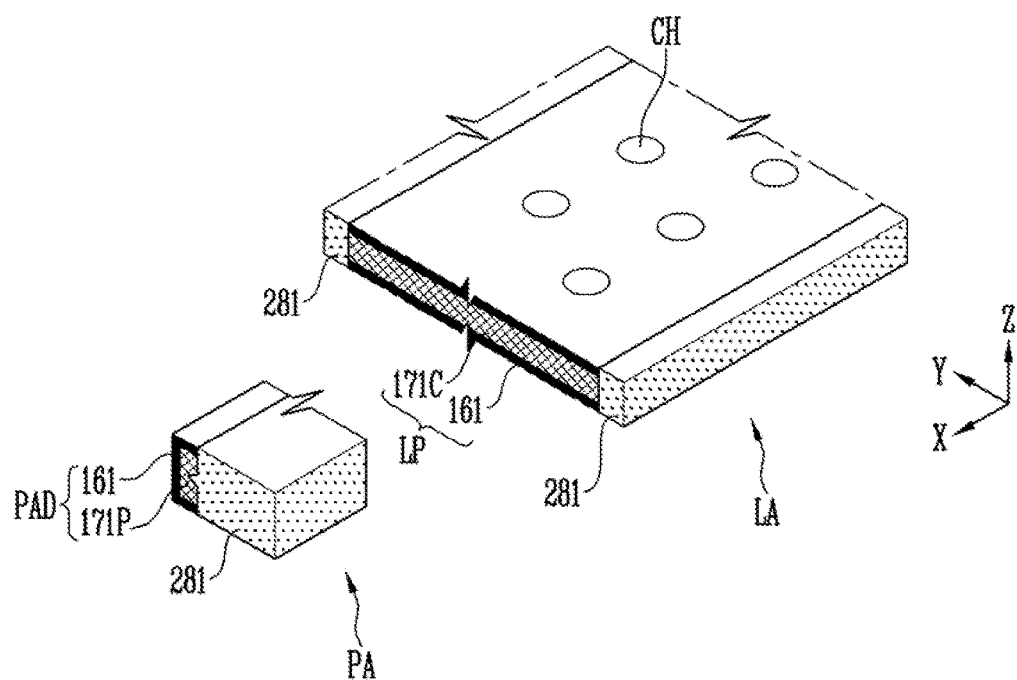

As shown in FIGS. 2C and 2D, the line pattern LP may include the center area and the side areas filled with the first conductive material pattern 171C. That is, the first conductive material pattern 171C may be formed to fill a space between the channel films CH. The first conductive material pattern 171C configuring the line pattern LP may extend further toward the first slit (SL1 of FIG. 1) than the first conductive material pattern 171P configuring the pad pattern PAD. The line pattern LP may further include the barrier metal 161. The barrier metal 161 may be formed along a surface of the first conductive material pattern 171C and open an outer sidewall of the first conductive material pattern 171C adjacent to the first and second slits (SL1 and SL2 of FIG. 1).

The configurations of the line pattern LP and the pad pattern PAD are not limited to the structure described above and may be diversely modified according to a manufacturing process.

As shown in FIGS. 2A and 2C, when the punch prevention pattern 191P is formed of the second conductive material, an edge of the line pattern area LA which is in contact with the first and second slits (SL1 and SL2 of FIG. 1) may be covered with the insulating pattern 181C. That is, the insulating pattern 181C may be formed on a sidewall of the line pattern LP and may be formed between the line pattern LP and the first slit (SL1 of FIG. 1) or between the line pattern LP and the second slit (SL2 of FIG. 1). The insulating pattern 181C may be formed of the same insulating material as that of the interlayer insulating film.

As shown in FIGS. 2B and 2D, the punch prevention pattern 281 may be formed of an insulating material having an etch selectivity different from that of the interlayer insulating films. For example, the punch prevention pattern 281 may be formed of an insulating material which is more difficult to etch than the interlayer insulating films formed of an oxide material, and may include a nitride material. The punch prevention pattern 281 may be formed to fill an edge of the pad pattern area PA adjacent to the first slit (SL1 of FIG. 1) and an edge of the line pattern area LA adjacent to the first and second slits (SL1 and SL2 of FIG. 1).

Figure 3A:
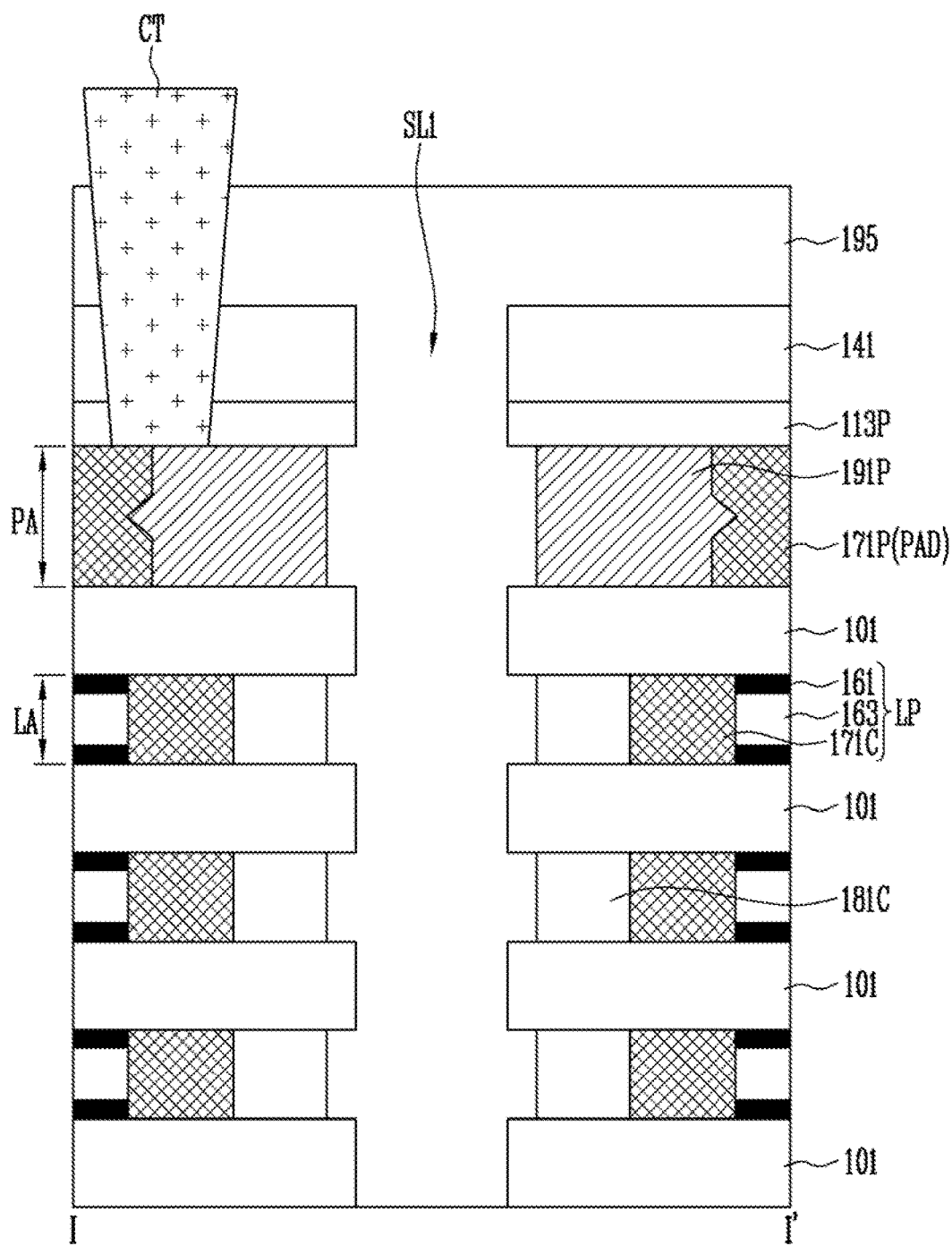
FIGS. 3A and 3B are cross-sectional views taken along line I-I' shown in FIG. 1 for describing contact plugs according to embodiments of the present invention.
Figure 3B:
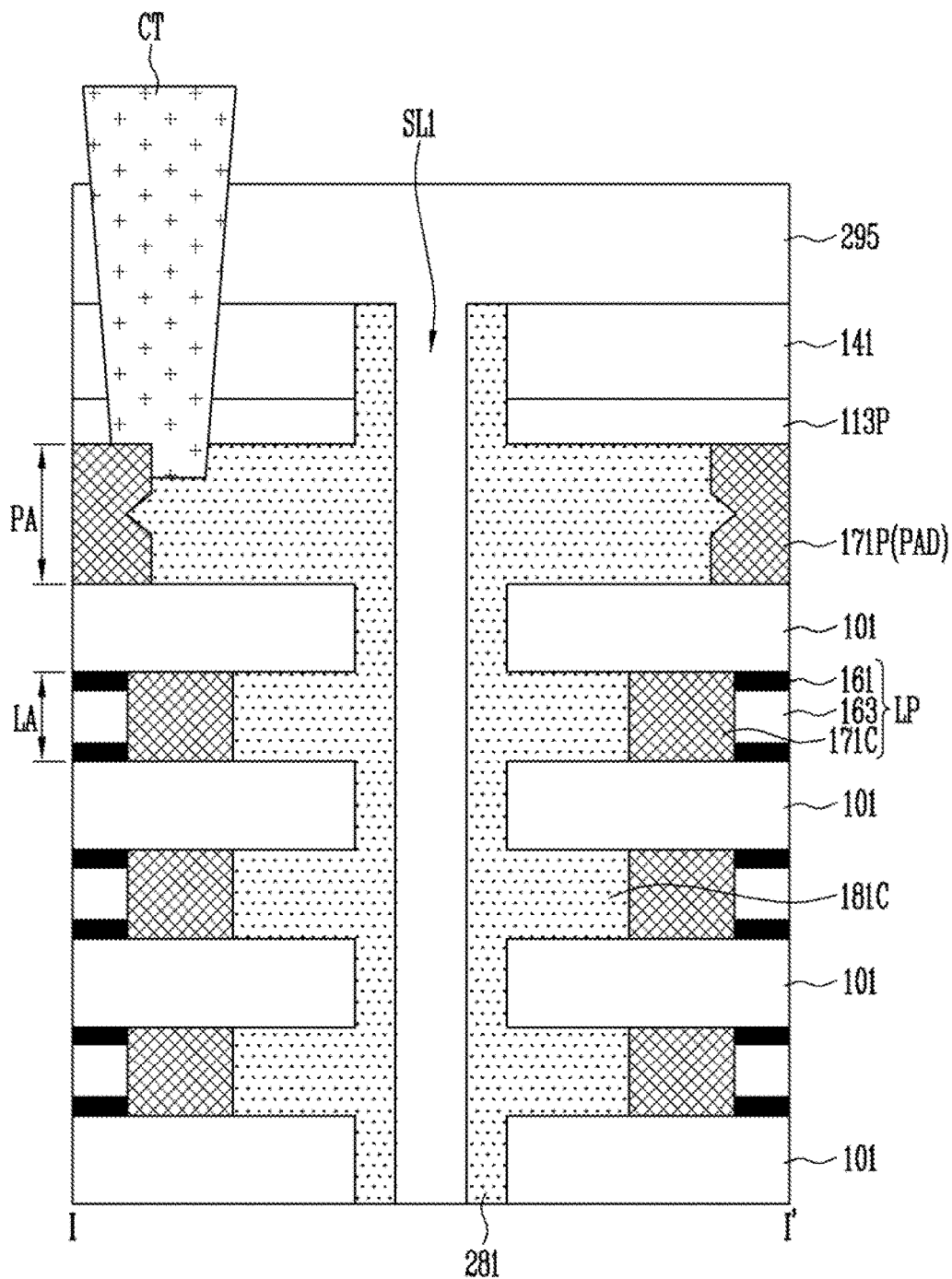

FIGS. 3A to 3B are cross-sectional views taken along line I-I' shown in FIG. 1 for describing contact plugs according to exemplary embodiments of the present invention.

Referring to FIGS. 3A and 3B, a second interlayer insulating film 141 may be formed on the first interlayer insulating films 101. As described above with reference to FIG. 1, the first interlayer insulating films 101 may have a stepped structure defined by first ends of the first interlayer insulating films 101. The pad pattern area PA may be arranged between the first end of each of the first interlayer insulating films 101 and the second interlayer insulating film 141. The line patterns LP may be stacked in a vertical direction. Each of the line patterns LP is arranged between adjacent first interlayer insulating films 101. In an embodiment, the line patterns LP may be arranged between the uppermost film among the first interlayer insulating films 101 and the second interlayer insulating film 141. See FIG. 3A. The line pattern area LA and the pad pattern area PA may be arranged at the same level where the memory cells and the select transistors are arranged. The line pattern area LA and the pad pattern area PA formed on the same plane may be in contact with each other.

A protection pattern 113P may be further formed to contact a lower portion of the second interlayer insulating film 141. In another embodiment, the protection pattern 113P may not be formed or may be removed according to a manufacturing method. The protection pattern 113P may be formed of an insulating material, for example, an oxide material. The first and second slits SL1 and SL2 shown in FIG. 1 may be extended to penetrate the second interlayer insulating film 141 and the protection pattern 113P.

A portion of the pad pattern area PA may include the pad pattern PAD. The pad pattern PAD may be formed to open an edge of the pad pattern area PA adjacent to the first slit SL1. The pad pattern PAD may include the first conductive material pattern 171P described above with reference to FIGS. 2A and 2B, but is not limited thereto. For example, the pad pattern PAD may be formed to have the structure described above with reference to FIGS. 2C and 2D.

The line pattern area LA may include the line pattern LP. The line pattern LP may be formed to open an edge of the line pattern area LA adjacent to the first and second slits (SL1 and SL2 of FIG. 1). The line pattern LP may include the barrier metal 161, the core pattern 163, and the first conductive material pattern 171C described above with reference to FIGS. 2A and 2B but is not limited thereto. For example, the line pattern LP may be formed to have the structure described above, with reference to FIGS. 2C and 2D.

The pad pattern PAD may be formed to have a greater thickness than the line pattern LP. A distance between the pad pattern PAD and the first slit SL1 may be greater than a distance between the line pattern LP and the first slit. SL1. That is, the line pattern LP may extend further toward the first slit SL1 than the pad pattern PAD.

Referring to FIG. 3A, an edge of the pad pattern area PA adjacent to the first slit SL1 may include the punch prevention pattern 191P, and an edge of the line pattern area LA adjacent to the first slit (SL1) and the second slit (SL2 of FIG. 1) may be filled with the insulating pattern 181C. When a groove is formed on a sidewall of the pad pattern PAD adjacent to the first slit SL1, the groove of the pad pattern PAD may be filled with the punch prevention pattern 191P. The punch prevention pattern 191P may be formed between the first slit SL1 and the pad pattern PAD. That is, the punch prevention pattern 191P may be spaced apart from a neighboring punch prevention pattern 191P by the first slit SL1, and may not be formed in the line pattern area LA and the first slit SL1. The punch prevention pattern 191P may be formed of the second conductive material.

The first slit SL1 may be filled with a slit insulating fill 195. The slit insulating film 195 may be formed to cover an upper portion of the second interlayer insulating film 141. The contact plug CT may be extended to an upper portion of the pad pattern PAD by penetrating the slit insulating film 195, the second interlayer insulating film 141, and the protection pattern 113P. The contact plug CT may be overlapped with the pad pattern PAD. At this time, a portion of the contact plug CT may be overlapped with an edge of the pad pattern area PA, which is not filled with the pad pattern PAD. When the punch prevention pattern 191P formed in the edge of the pad pattern area PA is formed of the second conductive material, the contact plug CT may be in contact with the punch prevention pattern 191P formed of the second conductive material. That is, the contact plug CT may be in contact with both of the pad pattern PAD and the punch prevention pattern 191P. See FIGS. 3A and 3B. Accordingly, an embodiment of the present invention can decrease a contact resistance of the contact plug CT.

In the process of forming the contact plug CT described above, a contact hole may be formed by etching the slit insulating film 195, the second interlayer insulating film 141, and the protection pattern 113P. At this time, since the punch prevention pattern 191P is formed of the second conductive material, insulating materials configuring the slit insulating film 195, the second interlayer insulating film 141, and the protection pattern 113P may have a great etch selectivity with respect to the punch prevention pattern 191P. Accordingly, in the process of forming the contact hole, even when the second interlayer insulating film 141 and the protection pattern 113P are over-etched, the punch prevention pattern 191P is not penetrated. Accordingly, an embodiment of the present invention can prevent the punch-through phenomenon.

Referring to FIG. 36, the punch prevention pattern 281 may further extend over an edge of the pad pattern area PA adjacent to the first slit SL1 and an edge of the line pattern area LA adjacent to the first slit SL1 and the second slit (SL2 of FIG. 1). As a result, the punch prevention pattern 281 extends over sidewalls of the first slit SL1 and the second slit (SL2 of FIG. 1). In FIG. 3B, the punch prevention pattern 281 may include a center portion formed along the sidewall of the first slit SL1, a branch portion extending from the center portion toward the sidewall of the line pattern LP and a branch portion extending from the center portion toward the sidewall of the pad pattern PAD. The branch portions may be formed at the same level where the line pattern LP and the pad pattern PAD are formed.

Although not shown, the punch prevention pattern 281 may include a center portion formed along the sidewall of the second slit (SL2 of FIG. 1) and a branch portion extending from the center portion of the second slit toward the sidewall of the line pattern LP. The punch prevention pattern 281 may be formed of an insulating material different from that of the first and second interlayer insulating films 101 and 141. More particularly, the insulating material for the punch prevention pattern 281 may be selected so that the insulating material for the first and second interlayer insulating films 101 and 141 have a greater etch selectivity with respect to that of the punch prevention pattern 281. For example, the first and second interlayer insulating films 101 and 141 may be formed of an oxide material, and the punch prevention pattern 281 may be formed of a nitride material. The center portion of the first slit SL1 and the center portion of the second slit SL2 including the punch prevention pattern 281 may be filled with a slit insulating film 295. The slit insulating film 295 may extend over the upper portion of the second interlayer insulating film 141. The contact plug CT may be extended to the upper portion of the pad pattern PAD by penetrating the slit insulating film 295, the second interlayer insulating film 141, and the protection pattern 113P. A portion of the contact plug CT may be overlapped with an edge of the pad pattern area PA. When the punch prevention pattern 281 is formed in the edge of the pad pattern area PA and is formed of the insulating material, the punch prevention pattern 281 may be over-etched and the contact plug CT may extend into an upper portion of the punch prevention pattern 281. Accordingly, the contact plug CT may have a stepped bottom surface and an upper surface of the pad pattern PAD and an upper surface of the punch prevention pattern 281 may be stepped from each other.

In the process of forming the contact plug CT described above a contact hole may be formed by etching the slit insulating film 295, the second interlayer insulating film 141, and the protection pattern 113P. The punch prevention pattern 281 may be formed of an insulating material that is more difficult to etch than the slit insulating film 295, the second interlayer insulating film 141, and the protection pattern 113P. Accordingly, in the process of forming the contact hole, even when the contact hole is over-etched, the punch prevention pattern 281 is not completely penetrated. Accordingly, an embodiment of the present invention can prevent the punch-through phenomenon.

Figure 4A:
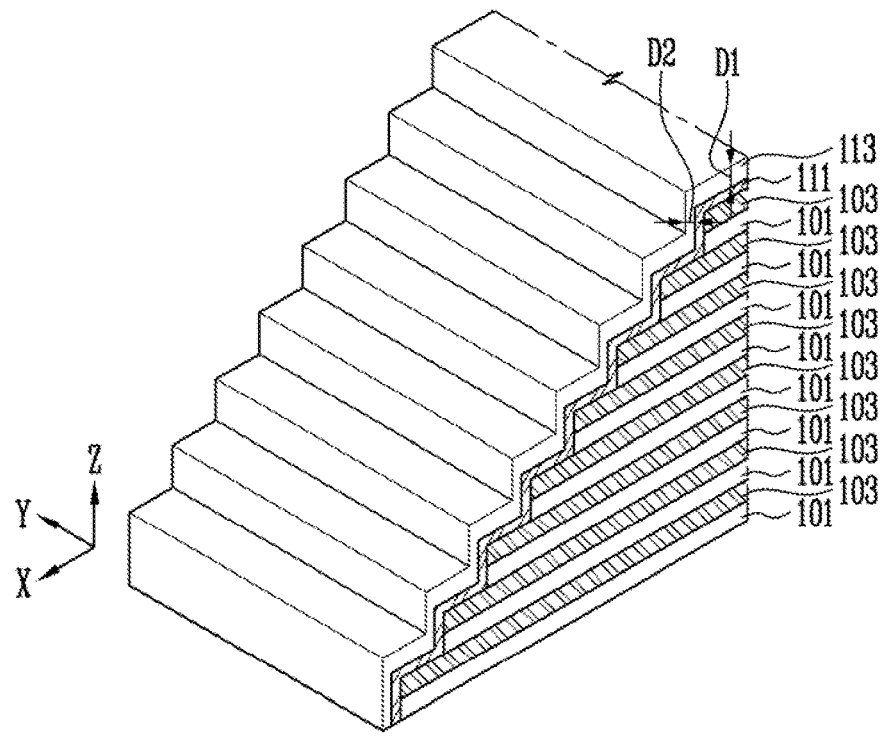
Figure 7A:
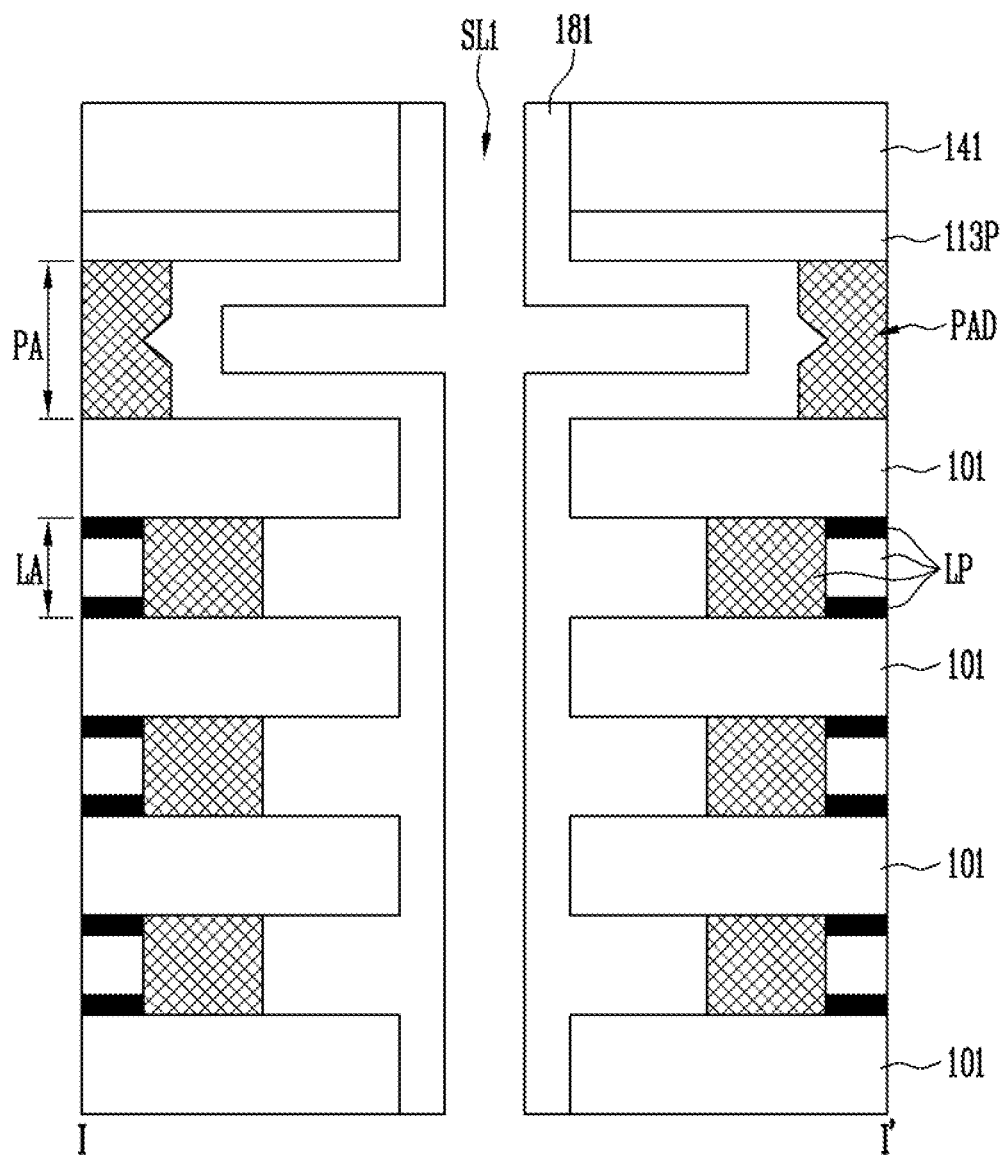
Figure 7B:
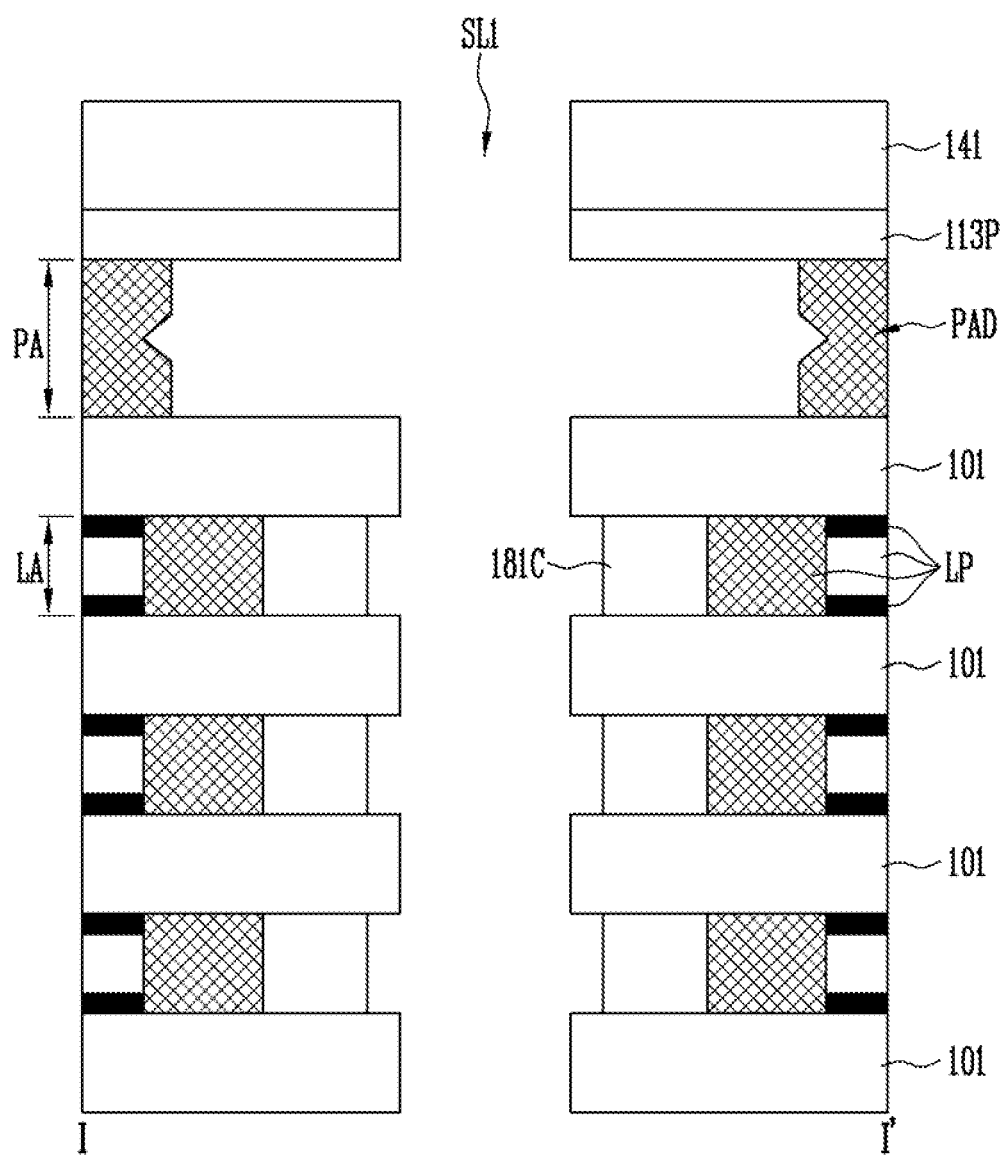
Figure 7C:
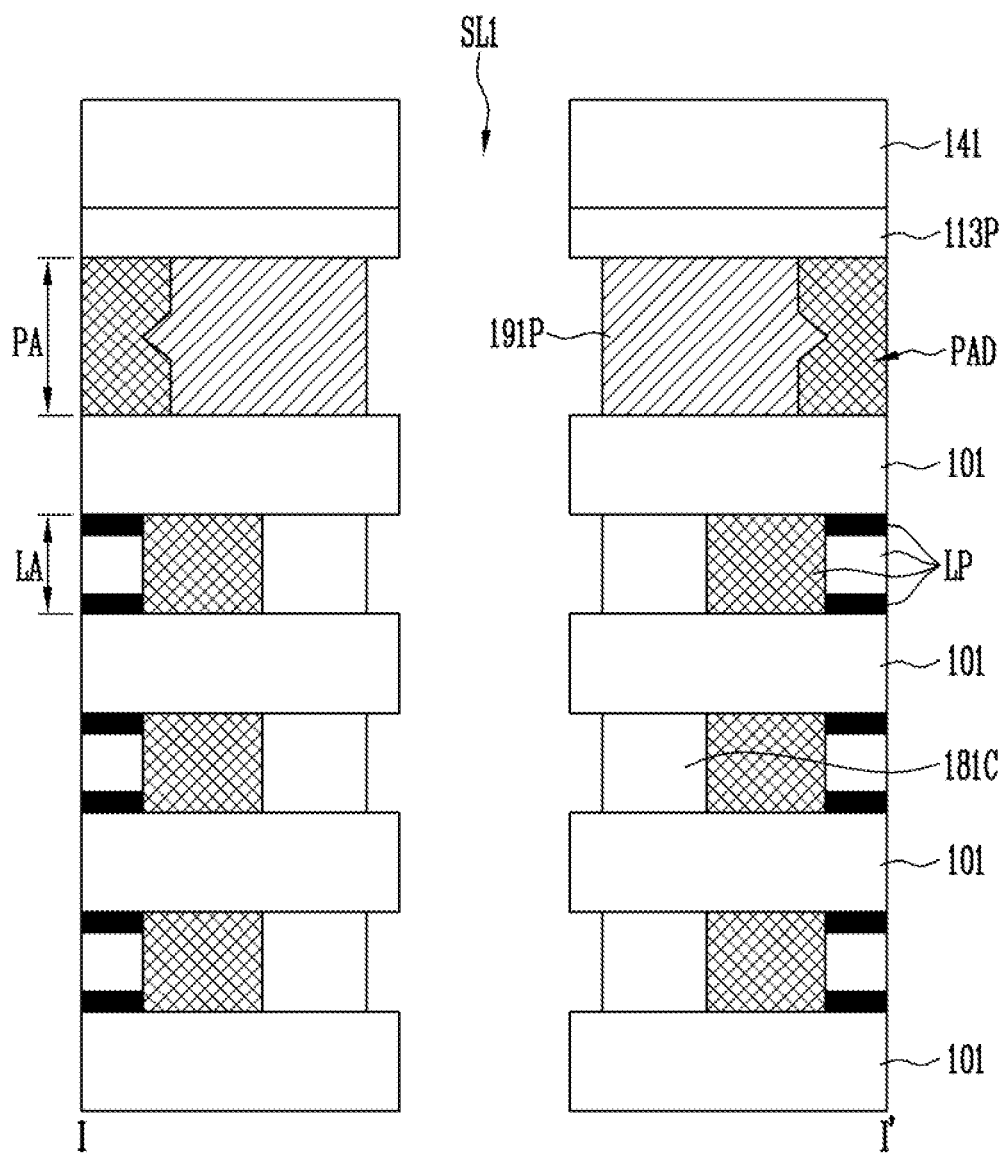
Figure 8:
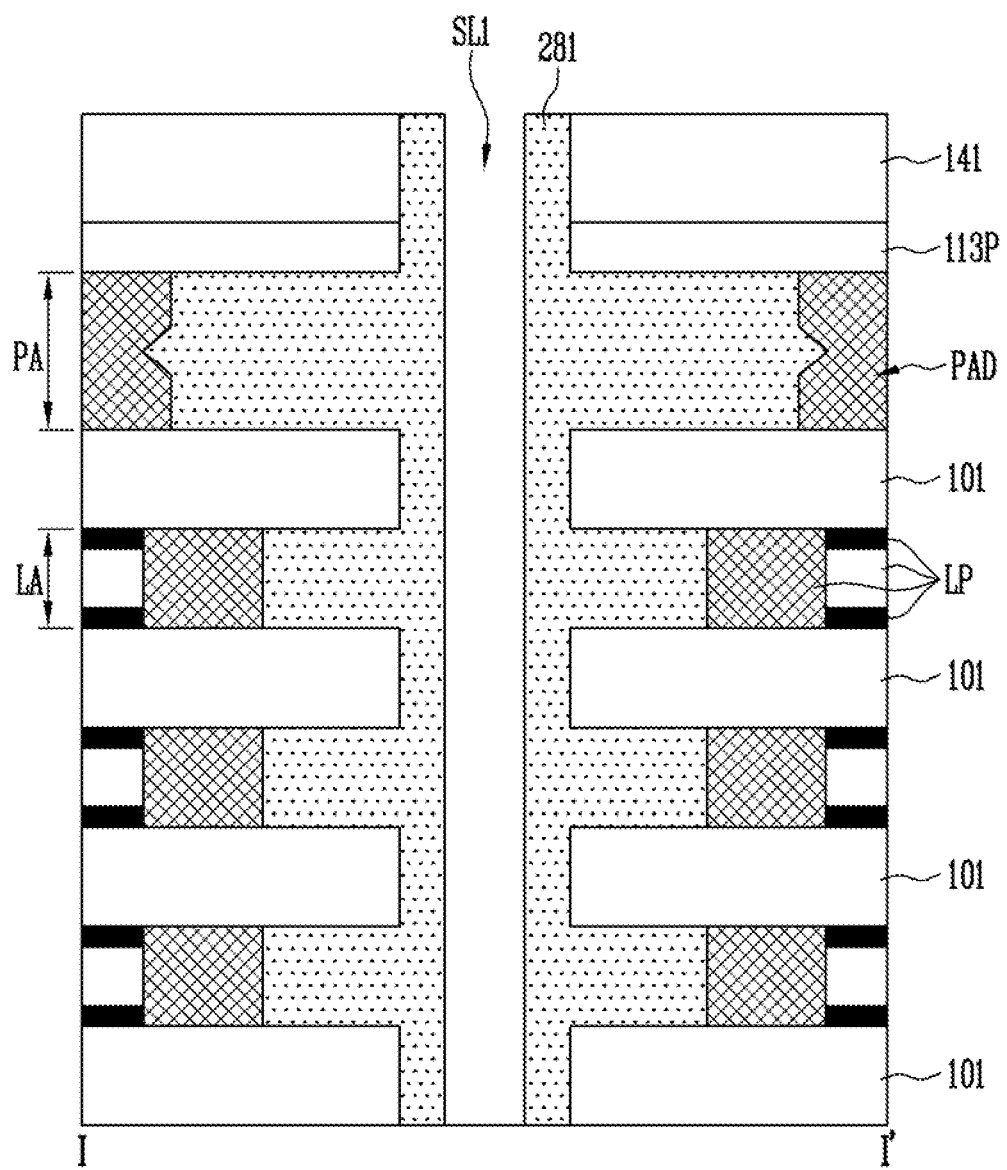

FIGS. 4A to 8 are diagrams for describing a method of manufacturing a semiconductor device according to exemplary embodiments of the present invention. More particularly, FIGS. 4A to 4C are perspective views illustrating the contact area shown in FIG. 1 for describing a process of opening the pad pattern region and the line pattern region. FIGS. 5A and 5B are cross-sectional views for describing a process of forming the first conductive material. FIG. 6 is a cross-sectional view illustrating a contact area taken along the line I-I' shown in FIG. 1 for describing a process of forming the line pattern and the pad pattern, FIGS. 7A to 7C are cross-sectional views illustrating a contact area taken along the line I-I' shown in FIG. 1 for describing a process of forming the punch prevention pattern according to an embodiment of the present invention. FIG. 8 is a cross-sectional view illustrating a contact area taken along the line I-I' shown in FIG. 1 for describing a process of forming the punch prevention pattern according to an exemplary embodiment of the present invention.

Referring to FIG. 4A, the first interlayer insulating films 101 and the first sacrificial film 103 may be alternately stacked on a lower structure (not shown).

The lower structure may vary according to a type of a memory string to be formed. For example, the lower structure may be a semiconductor substrate including a source region or a pipe gate including a pipe channel hole filled with a sacrificial material.

The number of the first interlayer insulating films 101 and the first sacrificial films 103, which are stacked, may vary. The first sacrificial films 103 may be formed at the same level where the line patterns and the pad patterns are formed. The first sacrificial films 103 may be formed of a material different from that of the first interlayer insulating films 101. More particularly, the first sacrificial films 103 may be formed of a material having a greater etch selectivity with respect to the first interlayer insulating films 101. For example, the first interlayer insulating films 101 may be formed of an oxide material, and the first sacrificial films 103 may be formed of a nitride material having a greater etch selectivity with respect to the oxide material.

A stepped structure may be formed by etching the first interlayer insulating films 101 and the first sacrificial films 103. At this time, each layer of the stepped structure may include one of the first interlayer insulating films 101 and one of the first sacrificial films 103. First ends of the first sacrificial films 103 may be exposed through the stepped structure.

Although not shown, the channel film CH described above with reference to FIG. 1 may be formed in the cell region after or before the forming of the stepped structure. After forming a channel hole penetrating the first interlayer insulating films 101 and the first sacrificial films 103, the channel film CH may be formed inside the channel hole. The channel film CH may be formed in a tube type by forming a semiconductor film along a sidewall surface of the channel hole so that the center area of the channel hole is opened. Alternatively, the channel film CH may be formed as a buried type by forming the semiconductor film inside the channel hole so that the center area of the channel hole is filled. Alternatively, the channel film CH may include both of the tube type and the buried type. The center area of the channel film CH having the tube type may be filled with an insulating material. Before forming the channel film CH, a multilayer insulating film may be formed along a sidewall surface of a through hole. The multilayer insulating film will be described with reference to FIGS. 8 and 9.

The second sacrificial film 111 may be formed over a surface of the first sacrificial films 103 exposed through the stepped structure. In another embodiment, the second sacrificial film 111 may be formed over a sidewall and an upper surface of the stepped structure. The second sacrificial film 111 may be formed of a material having a greater etch selectivity with respect to the first interlayer insulating films 101. The second sacrificial film 111 may be the same material as that of the first sacrificial films 103. For example, the second sacrificial film 111 may be formed of a nitride material.

Next, a protection film 113 may be formed over an upper surface and over a sidewall of the second sacrificial film 111. The protection film 113 may be formed of an insulating material with poor step coverage characteristics. More particularly, the protection film 113 may be formed of an insulating material in which a deposition thickness D1 on the upper surface of the stepped structure can be formed to be greater than a deposition thickness D2 on the sidewall of the stepped structure. For example, the protection film 113 may include a high density plasma (HDP) oxide film, a plasma enhanced-tetra ethyl ortho silicate (PE-TEOS) oxide film, an undoped silicate glass (USG) oxide film, or a combination thereof.

Figure 4B:
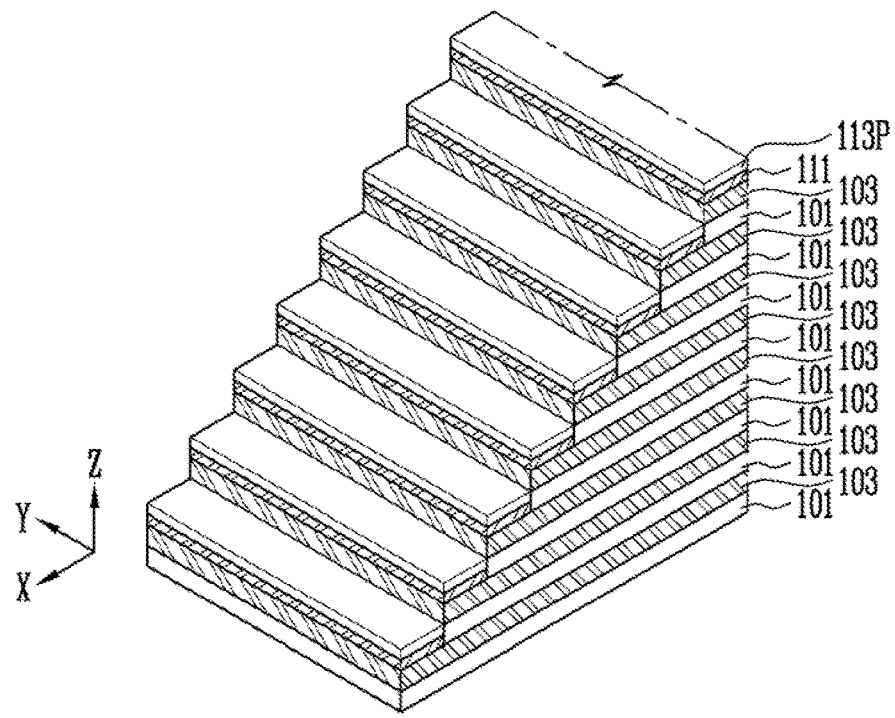

Referring to FIG. 4B, the protection patterns 113P may be formed by etching the protection film 113 so that the second sacrificial film 111 formed along the sidewall of the stepped structure is exposed. The protection film 113 may be etched by a wet etching process. The protection film 113 may be formed to have a relatively greater thickness on the upper surface than the sidewall of the stepped structure. Accordingly, even when a portion of the protection film 113 formed on the sidewall of the stepped structure is removed by the etching process, the protection film 113 formed on the upper surface of the stepped structure may remain and serve as the protection patterns 113P. A portion of the second sacrificial film 111 may be removed by an etching process, which uses the protection patterns 113P as an etching mask. Accordingly, the second sacrificial film 111 may expose sidewalls of the first sacrificial films 103, and remain on the first sacrificial films 103.

Figure 4C:
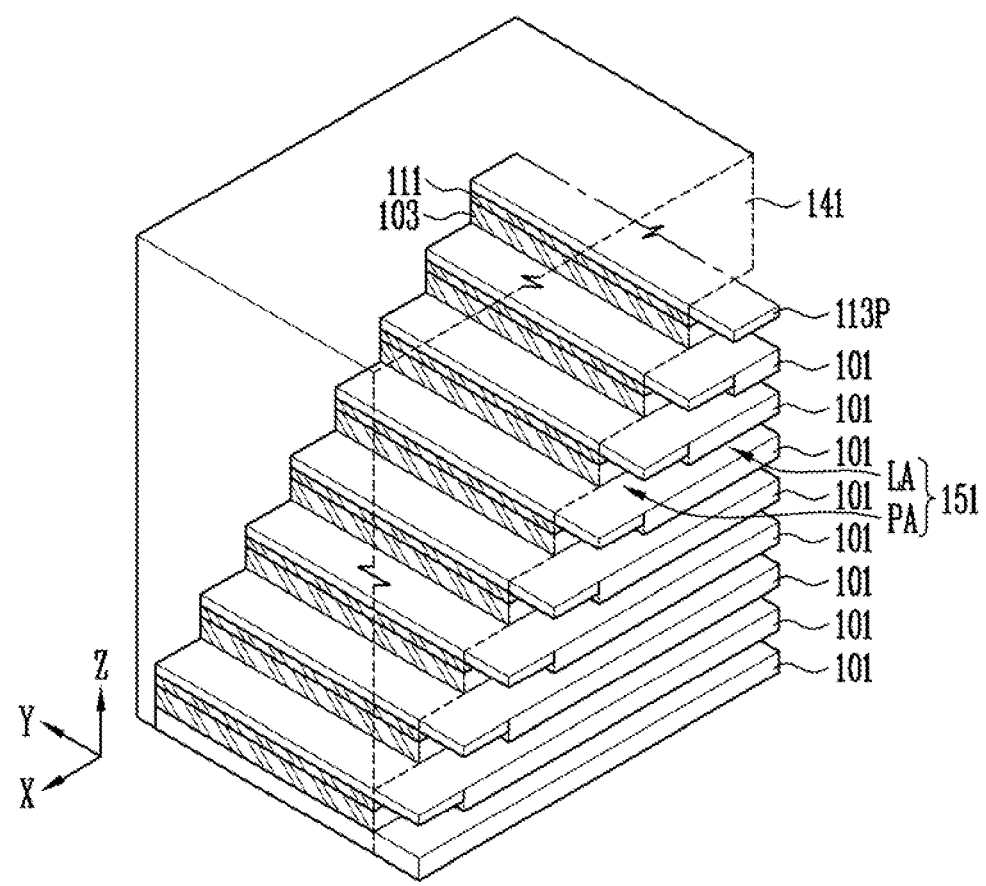

Referring to FIG. 4C, the second interlayer insulating film 141 may be formed covering the stepped structure that includes the first interlayer insulating films 101 and the first sacrificial films 103 which are alternately stacked, and the second sacrificial film 111. In FIG. 4C, a portion of the second interlayer insulating film 141 is illustrated so that openings 151 are clearly shown. The second interlayer insulating film 141 may be formed of an oxide material. A surface of the second interlayer insulating film 141 may be planarized by a planarization process.

The stack structure including the first and second interlayer insulating films 101 and 141 and the first and second sacrificial films 103 and 111 may be formed by the process described above. The first and second sacrificial films 103 and 111 of the stack structure may include a line portion and a pad portion. The line portion may be a portion where the first sacrificial films 103 are present but the second sacrificial film 111 is not present. The pad portion may include a portion where the second sacrificial film 111 is present and a portion where first ends of the first sacrificial films 103 overlap with the second sacrificial film 111. The pad portion may have a greater thickness than the line portion.

After forming the stack structure described above, slits (not shown) may be formed that penetrate the second interlayer insulating film 141, the protection patterns 113P, the second sacrificial film 111, the first sacrificial films 103, and the first interlayer insulating films 101. Accordingly, the sidewalls of the second sacrificial film 111 and the first sacrificial films 103 may be opened. The slits may include the first and second slits SL1 and SL2 described above with reference to FIG. 1. A shape and the number of the slits are not limited thereto, and may be diversely changed.

After this, the openings 151 may be formed by removing the second sacrificial film 111 and the first sacrificial films 103 exposed through the sidewalls of the slits using the etching process. At this time, the line portion and the pad portion of the first sacrificial films 103 and the pad portion of the second sacrificial film 111 may be etched, and the openings 151 may be formed. Each of the openings 151 may include the pad pattern area PA and the line pattern area LA. The pad pattern area PA may extend to an end of the line pattern area LA, and be formed to have a greater thickness than the line pattern area LA. Although not shown, the line pattern area LA may extend to the cell region (CELL of FIG. 1) and expose the multilayer memory film surrounding a sidewall of the channel film (CH of FIG. 1) or the channel film CH.

Figure 5A:
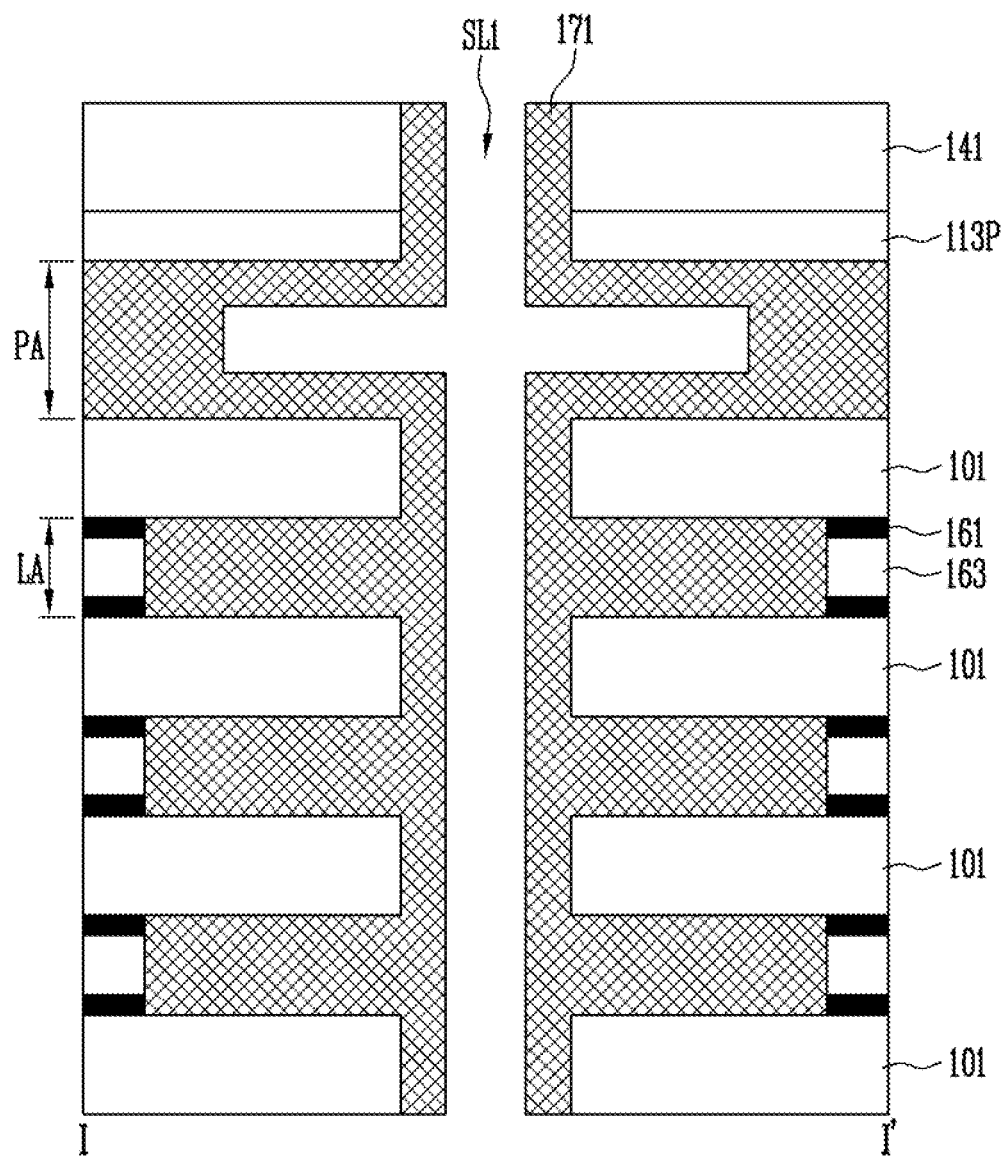

Referring to FIG. 5A, a first conductive material 171 may be formed along the openings 151 formed through the process described above with reference to FIGS. 4A to 4C, and a surface of the first slit SL1. Before forming the first conductive material 171, a portion of the line pattern area LA of each of the openings 151 may be filled with the core pattern 163 and the barrier metal 161. In another embodiment, the process of forming the core pattern 163 and the barrier metal 161 may be omitted. When the process of forming the core pattern 163 and the barrier metal 161 is omitted, the first conductive material 171 may be formed to fill the entire line pattern area LA. When the first conductive material 171 is formed of a metal such as tungsten, a barrier metal (not shown) may be further formed along surfaces of the openings 151 before forming the first conductive material 171.

The first conductive material 171 may be formed to fill the line pattern area LA of each of the openings 151. At this time, the pad pattern area PA having a relatively greater thickness than the line pattern area LA may not be filled with the first conductive material 171. Thus, an opening is formed in the center portion of the pad pattern area PA.

Figure 5B:
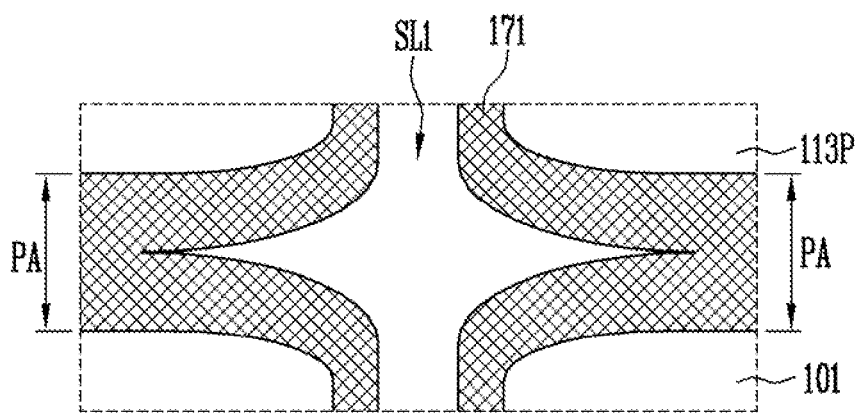

Referring to FIG. 5B, in the process of forming the openings 151, the first interlayer insulating film 101 and the protective pattern 113P exposed by the pad pattern area PA of each of the openings 151 may be bent. Accordingly, the pad pattern area PA may not be completely filled with the first conductive material 171, and the center portion of the pad pattern area PA may be opened.

Referring to FIG. 6, the first conductive material 171 (shown in FIG. 5B) may be removed from the inside of the first slit SL1, and the first conductive material 171 may be etched to be remained inside the openings 151. Accordingly, the first conductive material 171 may be separated into a plurality of first conductive material patterns 171P and 171C. At this time, an etch material etching the first conductive material 171 may be penetrated to the opened center portion of the pad pattern area PA, and the first conductive material 171 inside the pad pattern area PA may be etched more than that inside the line pattern area LA. Accordingly, the first conductive material pattern 171C of the line pattern area LA may be formed closer to the first slit (SL1) than the first conductive material pattern 171P of the pad pattern area PA. Further, a groove may be formed in a sidewall of the first conductive material pattern 171P of the pad pattern area PA.

The line pattern LP and the pad pattern PAD may be formed by the process described above with reference to FIGS. 5A to 6. A process of forming the punch prevention pattern that is performed after this may differ according to a material configuring the punch prevention pattern.

To form the punch prevention pattern with the second conductive material, as shown in FIG. 7A, an insulating material 181 may be formed along the surfaces of the openings 151 opened by the line pattern LP and the pad pattern PAD. At this time, the insulating material 181 may include an oxide material. The insulating material 181 may be formed to fill the line pattern area LA, and be formed not to fill the pad pattern area PA having a relatively greater thickness than the line pattern area LA. The center portion of the pad pattern area PA may be opened by the insulating material 181.

As shown in FIG. 7B, the insulating material 181 (shown in FIG. 7A) may be removed from the inside of the first slit SL1 and the pad pattern area PA. The insulating material 181 may remain inside the line pattern area LA. Since an etching material etching the insulating material 181 penetrates to the opened center portion of the pad pattern area PA, the insulating material 181 of the pad pattern area PA may be removed to open the sidewall of the pad pattern PAD while the insulating material 181 of the line pattern area LA remains. The line pattern LP of the line pattern area LA may be blocked by the insulating pattern 181C.

As shown in FIG. 7C, the punch prevention pattern 191P may be formed on the sidewall of the pad pattern PAD which is exposed by removal of the insulating pattern 181C. The punch prevention pattern 191P may be formed by forming the second conductive material using a deposition method or a selective growth method. Since the line pattern LP is blocked by the insulating pattern 181C, the second conductive material may not be connected to the line pattern LP. An embodiment of the present invention may form the second conductive material having a sufficient volume capable of filling the pad pattern area PA. To form the second conductive material having the sufficient volume capable of filling the pad pattern area PA, the second conductive material may fill the inside of the first slit SL1 and the pad pattern area PA. Then, the second conductive material inside the first slit SL1 may be removed. Since the second conductive material is insulated from the line pattern LP by the insulating pattern 181C over-etching the second conductive material for the purpose of insulation is unnecessary. Accordingly, the volume of the second conductive material remaining inside the pad pattern area PA may be increased.

Next, the forming of the slit insulating film 195 and the forming of the contact plug CT described above with reference to FIG. 3A may be performed. When forming the contact plug CT, the punch-through phenomenon may be decreased due to the punch prevention pattern 191P.

As shown in FIG. 8, in another embodiment, when forming the punch prevention pattern 281 with an insulating material having an etch selectivity with respect to the first and second interlayer insulating films 101 and 141, portions of the openings 151, which are opened by the line pattern LP and the pad pattern PAD, may be filled with the punch prevention pattern 281. The punch prevention pattern 281 may be formed along the sidewall surface of the first slit SL1, and the center portion of the first slit SL1 may be opened by the punch prevention pattern 281. A nitride material may be used as an insulating material for the punch prevention pattern 281.

Next, the slit insulating film 295 filling the center portion of the opened first slit SL1 and covering the second interlayer insulating film 141 may be formed. After this, the process of forming of the contact plug CT shown in FIG. 3B may be performed. By forming the contact plug CT, the punch-through phenomenon may decrease due to the punch prevention pattern 281.

Figure 9:
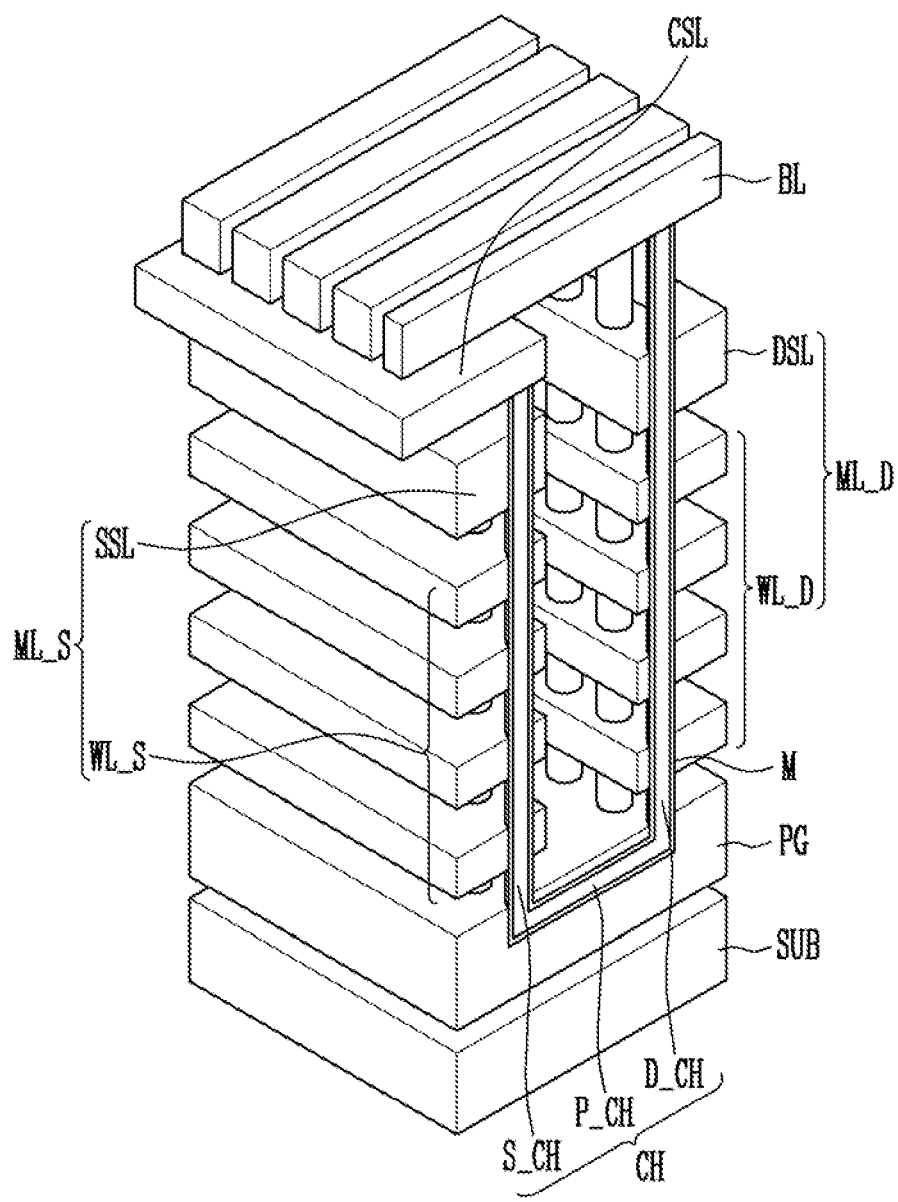
FIGS. 9 and 10 are perspective views for describing structures of memory strings of a semiconductor device according to embodiments of the present invention.
Figure 10:
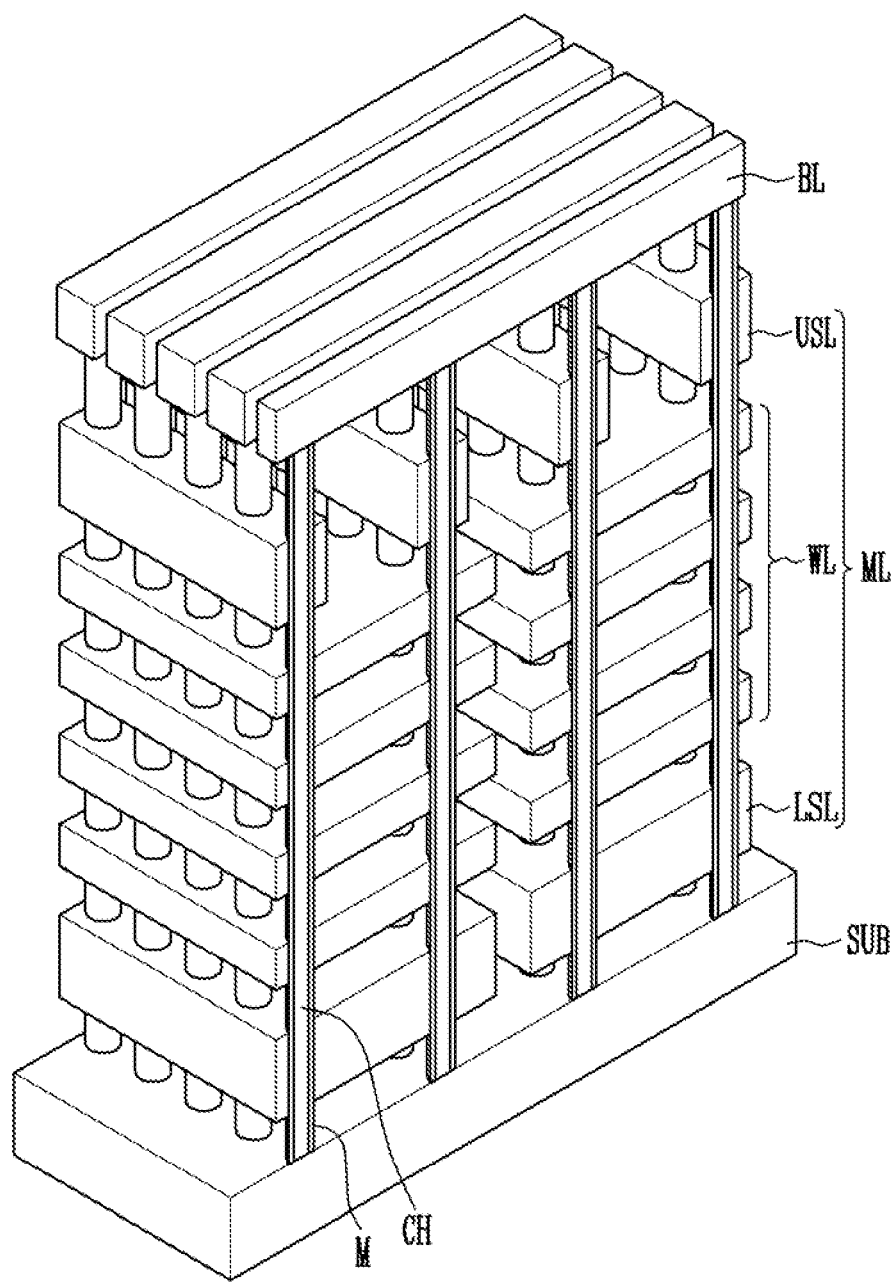

FIGS. 9 and 10 are perspective views for describing structures of a memory string of a semiconductor device according to an embodiment of the present invention. The insulating films are not illustrated in the following drawings for simplicity of description.

Referring to FIG. 9, a memory string may be formed along a channel film CH connected between a bit line BL and a common source line CSL. The drawing illustrates an example in which the channel film CH is formed in a U-shape. However, in another embodiment, the channel film CH may be formed in various types such as a W-shape, etc. The bit line BL and the common source line CSL may be formed spaced apart from each other at different levels. For example, the common source line CSL may be arranged at a lower level than the bit line BL. The bit line BL and the common source line CSL may be formed of a conductive material.

A pipe gate PG may be arranged under the bit line BL and the common source line CSL. The pipe gate PG may be formed of a conductive material.

A drain-side stack structure ML_D and a source-side stack structure ML_S may be arranged on the pipe gate PG. The drain-side stack structure ML_D and the source-side stack structure ML_S may be arranged on a lower portion of the bit line BL and the common source line CSL. The drain-side stack structure ML_D and the source-side stack structure ML_S may be electrically separated by the slit.

The drain-side stack structure ML_D may include drain-side conductive patterns WL_D and DSL which are spaced apart from each other and are stacked. The source-side stack structure ML_S may include source-side conductive patterns WL_S and SSL which are spaced apart from each other and are stacked. The drain-side conductive patterns WL_D and DSL may include at least one drain select line DSL, and drain-side word lines WL_D between the drain select line DSL and the pipe gate PG. The source-side conductive patterns WL_S and SSL may include at least one source select line SSL, and source-side word lines WL_S between the source select line SSL and the pipe gate PG.

The channel film CH may include a first portion D_CH penetrating the drain-side stack structure ML_D, a second portion S_CH penetrating the source-side stack structure ML_S, and a third portion P_CH connecting the first portion D_CH and the second portion S_CH by penetrating the pipe gate PG.

The first portion D_CH of the channel film CH may be electrically connected to the bit line BL. The second portion S_CH of the channel film CH may be electrically connected to the common source line CSL.

The channel film CH may be surrounded by a multilayer memory film M. The multilayer memory film M may include a charge blocking film, a data storage film, and a tunnel insulating film. The tunnel insulating film may be in contact with an outer wall of the channel film CH, the data storage film may be in contact with an outer wall of the tunnel insulating film, and the charge blocking film may be formed to contact an outer wall of the data storage film. The charge blocking film may be formed of an insulating material in which tunneling is possible, for example, a silicon oxide film. The data storage film may be formed of a material film in which a charge trap is possible, for example, a silicon nitride film. The charge blocking film may be formed of an insulating material in which a charge blocking is possible, for example, any one among a silicon oxide film and a high dielectric film having a higher dielectric constant than the silicon oxide film.

According to the structure described above, at least one drain select transistor, drain-side memory cells a pipe transistor, source-side memory cells, at least one source select transistor which are connected in series may configure one memory string, and may be arranged in a U-shape form.

The memory string described above may be formed using the process described above with reference to FIGS. 4A to 8 after forming the pipe gate PG including a pipe trench buried with a sacrificial film.

Referring to FIG. 10, the memory string may be formed as a straight type along the channel film CH. The memory string having the straight type may be electrically connected between the semiconductor substrate SUB including the source region and the bit line BL. A stack structure ML including conductive patterns LSL, WL, and USL which are spaced apart from each other and are stacked between a semiconductor substrate SUB and the bit line BL may be formed. The stack structure ML may be separated by the slit.

The semiconductor substrate SUB including a source region may be directly connected to a lower portion of the channel film CH. The source region may be formed by injecting impurities into the semiconductor substrate SUB, or by depositing a doped silicon film on the semiconductor substrate SUB.

The conductive patterns LSL, WL, and USL configuring the stack structure ML may include at least one lower select line LSL, word lines WL arranged on the lower select line LSL, and at least one upper select line USL arranged on the word lines WL. Here, the word lines WL may be formed as a plate type, and any one of the lower and upper select lines LSL and USL nay be formed as a line type. Alternatively, the word lines WL and the lower and upper select lines LSL and USL may be formed as a line type.

The channel film CH may be formed by penetrating the stack structure ML. The channel film CH may be surrounded by the multilayer memory film M described above with reference to FIG. 8. The channel film CH may be electrically connected to the bit line BL.

According to the structure described above, at least one lower select transistor, memory cells, and at least one upper select transistor, which are connected in series, may configure one memory string, and may be arranged in a row.

The cell structure described above may be formed on the semiconductor substrate SUB including the source region using the process described above with reference to FIGS. 4A to 8.

Figure 11:
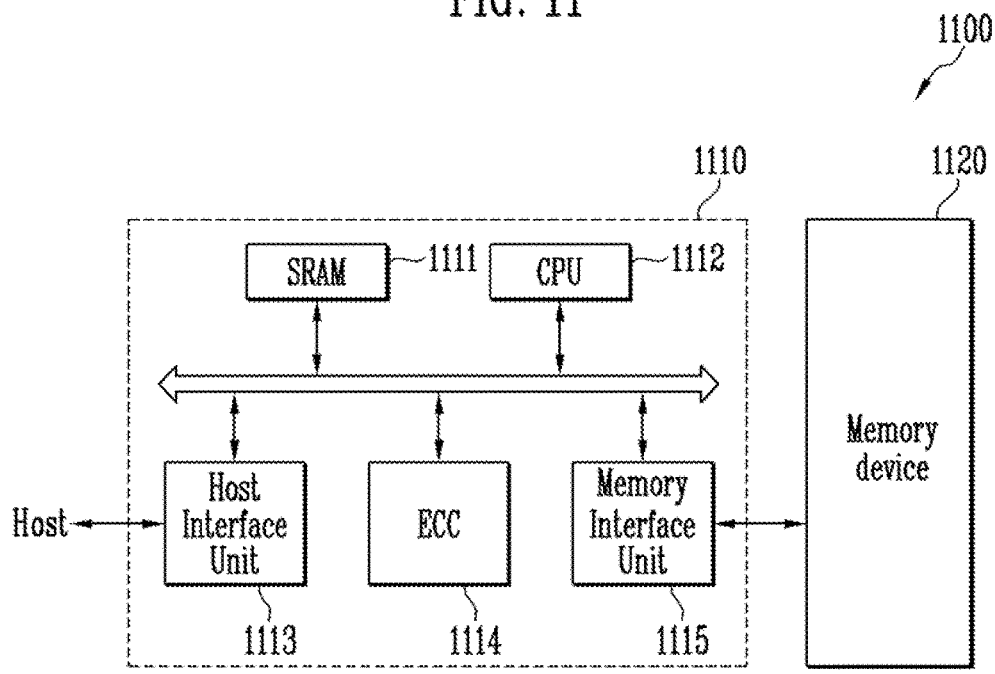
FIG. 11 is a block diagram illustrating a memory system according to an exemplary embodiment of the present invention.

FIG. 11 is a block diagram illustrating a memory system according to an exemplary embodiment of the present invention.

Referring to FIG. 11, a memory system 1100 according to an exemplary embodiment of the present invention may include a memory device 1120 and a memory controller 1110.

The memory device 1120 may have the structure described above with reference to FIGS. 1 to 10. Further, the memory device 1120 may be a multi chip package in which a plurality of flash memory chips are included.

The memory controller 1110 may be configured to control the memory device 1120, and may include a static random access memory (SRAM) 1111, a central processing unit (CPU) 1112, a host interface unit 1113, an error correction circuit (ECC) 1114, and a memory interface unit 1115. The SRAM 1111 may be used as an operating memory of the CPU 1112, the CPU 1112 may perform various control operations for data exchange of the memory controller 1110, and the host interface unit 1113 may include a data exchange protocol of a host connected to the memory system 1100. Further, the ECC 1114 may detect and correct an error included in data read from the memory device 1120, and the memory interface unit 1115 may perform an interface with the memory device 1120. Further, the memory controller 1110 may further include a read only memory (ROM), etc. for storing code data for an interface with the host.

The memory system 1100 may be a memory card or a solid state disk (SSD) configured by combining the memory device 1120 and the memory controller 1110. For example, when the memory system 1100 is the SSD, the memory controller 1110 may communicate with the outside (for example, the host) through at least one among various protocols such as a Universal Serial Bus (USB) protocol, a MultiMediaCard (MMC) protocol, a Peripheral Component Interconnect (PCI)-Express (PCI-E) protocol, a Serial Advanced Technology Attachment (SATA) protocol, a Parallel ATA (PATA) protocol, a Small Computer System Interface (SCSI) protocol, an Enhanced Small Disk Interface (ESDI) protocol, an Integrated Drive Electronics (IDE) protocol, etc.

Figure 12:
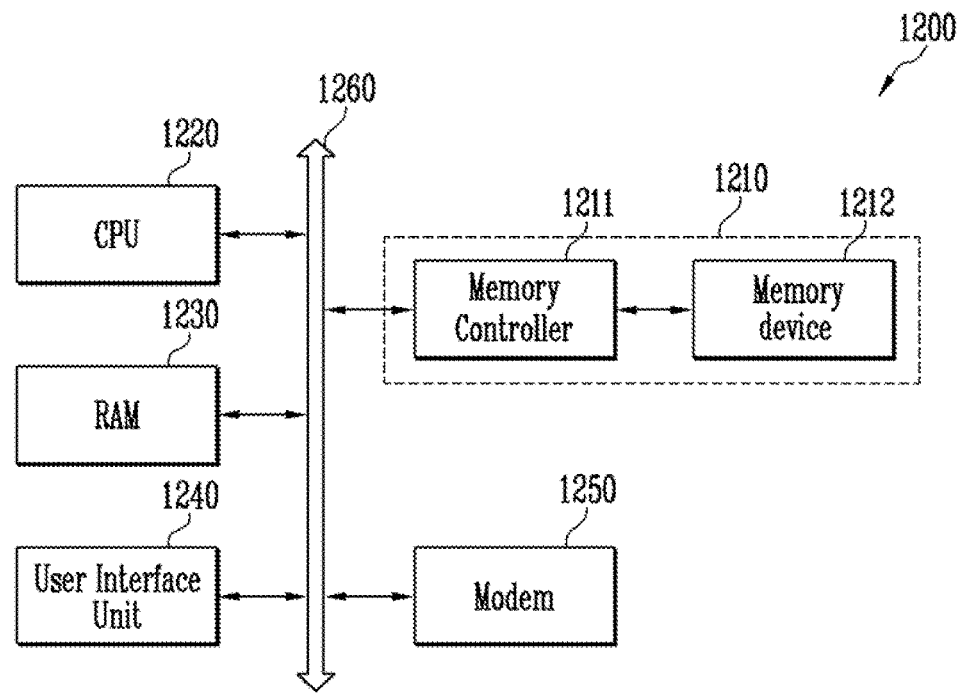
FIG. 12 is a block diagram illustrating a computing system according to an exemplary embodiment of the present invention.

FIG. 12 is a block diagram illustrating a computing system according to an exemplary embodiment of the present invention.

Referring to FIG. 12, a computing system 1200 according to an exemplary embodiment of the present invention may include a CPU 1220, a RAM 1230, a user interface unit 1240, a modem 1250, and a memory system 1210, which are electrically connected to a system bus 1260. Further, when the computing system 1200 is a mobile device, a battery for supplying an operating voltage to the computing system 1200 may be further included. Additionally, an application chipset, a camera image processor (CIS), and a mobile DRAM, etc. may be further included.

The memory system 1210 may include a memory device 1212, and a memory controller 1211 as described above with reference to FIG. 11.

An embodiment of the present invention can reduce structural defects of the semiconductor device and increase stability of an operation of the semiconductor device by forming the punch prevention pattern which is in contact with the sidewall of the pad pattern inside the pad pattern area opened by the pad pattern.

The technical spirit of the present invention has been described in detail with reference to the exemplary embodiments above, but it should be noted that the embodiments are used for the description and are not for purposes of limitation. Therefore, it will be understood by those of ordinary skill in the art that various changes in form and details may be made therein without departing from the spirit and scope of the present invention as defined by the following claims.

What is claimed is:

1. A semiconductor device, comprising:
    interlayer insulating films spaced apart from each other and arranged in a stack, wherein first ends of the interlayer insulating films form a stepped structure;
    a slit penetrating the interlayer insulating films and dividing the interlayer insulating films into a plurality of stack structures;
    line patterns arranged between adjacent interlayer insulating films;

pad patterns connected to the line patterns and formed over the first ends of the interlayer insulating films, wherein the pad patterns are formed of a conductive material; and at least one punch prevention pattern formed over the first ends of the interlayer insulating films, the punch prevention pattern having a surface facing sidewalls of the pad patterns.

2. The semiconductor device of claim 1, wherein a distance between each of the line patterns and the slit is shorter than a distance between each of the pad patterns and the slit.

3. The semiconductor device of claim 1, further comprising:
channel films penetrating the interlayer insulating films and the line patterns.

4. The semiconductor device of claim 1, wherein the pad patterns have greater thicknesses than the line patterns.

5. The semiconductor device of claim 1, wherein each of the pad patterns and the line patterns includes a first conductive material, and
wherein a distance between each of the line patterns and the slit is shorter than a distance between each of the pad patterns and the slit.

6. The semiconductor device of claim 1, wherein the punch prevention pattern is separated by the slit and is formed over the sidewalls of the pad patterns.

7. The semiconductor device of claim 6, further comprising:
insulating patterns arranged between the slit and the line patterns,
wherein the insulating patterns being interposed between the interlayer insulating films.

8. The semiconductor device of claim 6, wherein the punch prevention pattern includes a second conductive material.

9. The semiconductor device of claim 1, wherein the punch prevention pattern includes a center portion along a sidewall of the slit, and branch portions extending from the center portion toward sidewalls of the line patterns and the sidewalls of the pad patterns.

10. The semiconductor device of claim 9, wherein the punch prevention pattern is formed of an insulating material different from that of the interlayer insulating films.

11. The semiconductor device of claim 10, wherein the insulating material comprises a nitride material.

12. The semiconductor device of claim 1, further comprising:
a contact plug which is in contact with any one of the pad patterns and the punch prevention pattern.

13. A semiconductor device, comprising:
a memory cell stack provided in a cell region;
a line pattern extending from the memory cell stack to a contact region in a first direction;

a pad pattern extending from the line pattern and provided in the contact region, wherein the pad pattern is formed of a conductive material;

a punch prevention pattern extending from the pad pattern in a second direction perpendicular to the first direction and provided in the contact region; and a contact plug being in contact with an upper surface of the pad pattern and an upper surface of the punch prevention pattern.

14. The semiconductor device of claim 13, further comprising:
a slit insulating film extending in a third direction,
wherein the third direction is perpendicular to both of the first and the second directions,
wherein the punch prevention pattern is formed between the pad pattern and the slit insulating film.

15. The semiconductor device of claim 14, further comprising:
first and second insulating films each extending from the memory cell stack to the contact region in the first direction,
wherein the first insulating film is provided at a first level,
wherein the second insulating film is provided at a second level upper than the first level,
wherein both of the pad pattern and the punch prevention pattern are provided between the first and second insulating films, and
wherein the contact plug penetrates the second insulating film to be coupled to both of the pad pattern and the punch prevention pattern.

16. The semiconductor device of claim 15,
wherein the punch prevention pattern extends in the third direction and is provided between a sidewall of the first insulating film and the slit insulating film.

17. The semiconductor device of claim 13,
wherein the pad pattern and the punch prevention pattern are flush with each other.

18. The semiconductor device of claim 13,
wherein the punch prevention pattern has a concave portion, the concave portion being filled with the contact plug and adjacent to the pad pattern.

19. The semiconductor device of claim 13, further comprising:
wherein the memory cell stack includes a memory cell in the cell region, and
wherein the contact plug is coupled to the memory cell via the pad pattern and the line pattern.

20. The semiconductor device of claim 1,
wherein the at least one punch prevention pattern has sidewalls contacting sidewalls of the pad patterns and sidewalls of the line patterns.

* * * * *